United States Patent
Shen et al.

(10) Patent No.: US 10,389,483 B2
(45) Date of Patent: *Aug. 20, 2019

(54) RATE MATCHING METHOD AND APPARATUS FOR POLAR CODE

(71) Applicant: HUAWEI TECHNOLOGIES CO., LTD., Shenzhen, Guangdong (CN)

(72) Inventors: Hui Shen, Shenzhen (CN); Bin Li, Shenzhen (CN); Yuchen Shi, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/234,925

(22) Filed: Aug. 11, 2016

(65) Prior Publication Data

US 2016/0352464 A1  Dec. 1, 2016

Related U.S. Application Data

(63) Continuation of application No. PCT/CN2014/072365, filed on Feb. 21, 2014.

(51) Int. Cl.
*H03M 13/03* (2006.01)
*H04L 1/00* (2006.01)
(Continued)

(52) U.S. Cl.
CPC .......... *H04L 1/0057* (2013.01); *H03M 13/13* (2013.01); *H03M 13/2792* (2013.01);
(Continued)

(58) Field of Classification Search
CPC ............... H03M 13/13; H03M 13/635; H03M 13/2792; H03M 13/275; H03M 13/09;
(Continued)

(56) References Cited

U.S. PATENT DOCUMENTS 5,799,033 A    8/1998  Baggen
8,543,884 B2   9/2013  Mansour
(Continued)

FOREIGN PATENT DOCUMENTS

CN    1357172       7/2002
CN    101159513     4/2008
(Continued)

OTHER PUBLICATIONS

XP50111968. R1-040041, Nortel Networks et al., "Text proposal for Section 6.2.4 of TR 25.892", 3GPP TSG-RAN-1 Ad-Hoc, Nortel Networks, LG Electronics. Espoo, Finland, Jan. 27-30, 2004. total 2 pages.

(Continued)

*Primary Examiner* — Guerrier Merant
(74) *Attorney, Agent, or Firm* — Staas & Halsey LLP (57) ABSTRACT

A rate matching method for a polar code is provided, where the method includes: acquiring a congruential sequence according to a code length of a target polar code; performing sorting processing on the congruential sequence according to a preset rule, to acquire a reference sequence; determining a mapping function according to the congruential sequence and the reference sequence; and interleaving the target polar code according to the mapping function, to generate interleaved output bits.

18 Claims, 8 Drawing Sheets

(51) Int. Cl.
- H03M 13/13 (2006.01)
- H03M 13/00 (2006.01)
- H03M 13/27 (2006.01)
- H04L 1/18 (2006.01)

(52) U.S. Cl.
CPC ........ *H03M 13/635* (2013.01); *H04L 1/0041* (2013.01); *H04L 1/0067* (2013.01); *H04L 1/0069* (2013.01); *H04L 1/0071* (2013.01); *H04L 1/1812* (2013.01)

(58) Field of Classification Search
CPC ........... H03M 13/2906; H03M 13/353; H03M 13/356; H03M 13/6525; H04L 1/0041; H04L 1/0057; H04L 1/0067; H04L 1/0069; H04L 1/0071; H04L 1/1812; H04L 1/00; H04L 1/0061; H04L 1/0068

See application file for complete search history.

(56) References Cited

U.S. PATENT DOCUMENTS

| | | | |
|---|---|---|---|
| 2002/0032890 | A1 | 3/2002 | Rowitch et al. |
| 2004/0146029 | A1 | 7/2004 | Tong et al. |
| 2006/0256708 | A1 | 11/2006 | Wang et al. |
| 2008/0141031 | A1 | 6/2008 | Oba et al. |
| 2008/0301536 | A1 | 12/2008 | Shin et al. |
| 2012/0198305 | A1 | 8/2012 | Abu-Surra et al. |
| 2013/0318416 | A1 | 11/2013 | Tong et al. |
| 2013/0343271 | A1 | 12/2013 | El-Khamy et al. |
| 2014/0016570 | A1 | 1/2014 | Ma et al. |
| 2014/0019820 | A1 | 1/2014 | Vardy et al. |
| 2014/0108748 | A1 | 4/2014 | Lee et al. |
| 2014/0169492 | A1* | 6/2014 | Mahdavifar .......... H03M 13/13 375/267 |
| 2014/0173376 | A1 | 6/2014 | Jeong et al. |
| 2015/0194987 | A1 | 7/2015 | Li et al. |
| 2016/0020926 | A1 | 1/2016 | Chen et al. |
| 2016/0079999 | A1 | 3/2016 | Shen et al. |
| 2016/0182187 | A1* | 6/2016 | Kim ...................... H03M 13/09 714/807 |
| 2017/0288703 | A1* | 10/2017 | Shen ................. H03M 13/2792 |

FOREIGN PATENT DOCUMENTS

| | | |
|---|---|---|
| CN | 102164025 A | 8/2011 |
| CN | 103023618 A | 4/2013 |
| CN | 103220083 A | 7/2013 |
| CN | 103281166 A | 9/2013 |
| CN | 103684477 | 3/2014 |
| CN | 104219019 | 12/2014 |
| EP | 2 824 841 B1 | 4/2016 |
| JP | 2001-57521 A | 2/2001 |
| JP | 2009-33340 A | 2/2009 |
| JP | 2010-502040 A | 1/2010 |
| JP | 2011-139475 | 7/2011 |
| KR | 1020130035407 | 4/2013 |
| KR | 1020130140780 A | 12/2013 |
| RU | 2186459 C2 | 7/2002 |
| RU | 2235424 C2 | 8/2004 |
| RU | 2 376702 C2 | 12/2009 |
| RU | 2375822 C2 | 12/2009 |
| WO | 2013152605 A1 | 10/2013 |
| WO | 2013191435 A1 | 12/2013 |
| WO | WO2014098480 | 6/2014 |

OTHER PUBLICATIONS

XP2131001, Clark, G.C. et al., "Pseudorandom Interleavers," Sec. 8.3.2 in: Error-correction Coding for Digital Communications. Springer Science & Business Media, 2013, pp. 349-52. total 4 pages.

XP31837845, Cheng, Jung-Fu et al., "Coding performance of HARQ with BICM—Part II: LTE Circular Buffer Rate Matching & Extension", 2010 IEEE 21st Intl. Symp. on Personal Indoor and Mobile Radio Communications. Sep. 26, 2010. total 6 pages.

3GPP TSG-RAN WG1#49, R1-072452, "Performance Evaluation of Rate Matching Algorithms," Ericsson, Kobe, Japan, May 7-11, 2007. total 4 pages.

Arikan, E., "Channel polarization: A method for constructing capacity-achieving codes for symmetric binary-input memoryless channels," IEEE Transactions on Information Theory 55(7), pp. 3051-3073, 2009.

Tal, I. et al., "List Decoding of Polar Codes", Information Theory Proceedings (ISIT), IEEE Transactions on Information Theory 61(5). Jul. 31, 2011, total 11 pages.

Cadambe, Viveck R. et al., "Interference Alignment and Degrees of Freedom of the K-User Interference Channel," IEEE Transactions on Information Theory 54(8), Aug. 2008. total 17 pages.

"Design of DL Transport Channel Processing and Multiplexing," 3GPP TSG-RAN WG1#76, Prague, Czech Republic, Feb. 10-14, 2014, R1-140250, 6 pages.

Cadambe, V. et al., Interference Alignment and Spatial Degrees of Freedom for the K User Interference Channel, IEEE ICC 2008 Proceedings, pp. 971-975.

International Search Report, dated Aug. 19, 2015, in International Application No. PCT/CN2014/094475 (5 pages).

Notice to Submit a Response, dated Mar. 29, 2018, in Korean Application No. 10-2017-7020438 (7 pp.).

U.S. Appl. No. 15/629,498, filed Jun. 21, 2017, Hui Shen et al., Huawei Technologies Co., Ltd.

Kai Chen et al., "A Hybrid ARQ Scheme Based on Polar Codes," IEEE Communications Letters, vol. 17, No. 10, Oct. 2013, pp. 1996-1999.

Kai Chen et al., "Polar Coded HARQ Scheme with Chase Combining," arXiv:1310.6650v2 [cs.IT] Jan. 10, 2014, Key Laboratory of Universal Wireless Communications, Ministry of Education, Beijing University of Posts and Telecommunications, (6 pp.).

Notice of Allowance, dated Oct. 10, 2018, in European Application No. 14883336.1 (41 pp.).

Russian Office Action dated Jul. 19, 2018, in corresponding Russian Patent Application No. 2017125830/08, 12 pgs.

Japanese Notice of Allowance dated May 29, 2018 in corresponding Japanese Patent Application No. 2016-551736.

Miyamoto, Kohei et al.,"Performance Evaluation of Sparse Superposition Codes by Numerical Experiments," The Institute of Electronics, Information and Communication Engineers, May 2014, pp. 49-54.

Japanese Office Action dated Jun. 25, 2018, in corresponding Japanese Patent Application No. 2017-550969, 6 pgs.

Bin Li et al., "Parallel Decoders of Polar Codes," published on Sep. 4, 2013, 4 pgs.

Kai Niu et al., "Polar Codes: Primary Concepts and Practical Decoding Algorithms", IEEE Communications Magazine, Jul. 2014, pp. 192-203.

Australian Office Action dated Jun. 18, 2018 in corresponding Australian Patent Application No. 2014415500, 4 pgs.

Official Action, dated Dec. 10, 2018, in Russian Application No. 2017125830 (7 pp.).

Notice of Allowance, dated Nov. 29, 2018, in Korean Application No. 1020177020438 (2 pp.).

Search Report, dated Feb. 15, 2019, in Chinese Application No. 201480082806.8 (3 pp.).

Office Action, dated Feb. 22, 2019, in Chinese Application No. 201480082806.8 (3 pp.).

Office Action, dated Apr. 12, 2019, in U.S. Appl. No. 15/629,498 (6 pp.).

* cited by examiner

RATE MATCHING METHOD AND APPARATUS FOR POLAR CODE

CROSS-REFERENCE TO RELATED APPLICATIONS

This application is a continuation of International Application No. PCT/CN2014/072365, filed Feb. 21, 2014, which is hereby incorporated by reference in its entirety.

TECHNICAL FIELD

Embodiments of the present invention relate to the field of communications technologies, and in particular, to a rate matching method and apparatus for a polar code.

BACKGROUND

In a communications system, generally, channel coding is used to improve reliability of data transmission and to ensure quality of communication. A polar code is a linear block code, and is an encoding manner in which it has been theoretically proved that the polar code can obtain a Shannon capacity, with low coding and decoding complexity.

To improve communication performance, a Hybrid Automatic Repeat Request (HARQ) technology may be used. Rate matching needs to be performed on a Polar code to match a bearing capacity of a physical channel, and a bit transmitted in HARQ retransmission each time is determined by using rate matching.

In the prior art, a traditional HARQ technology of random (or quasi-random) puncturing is used for a Polar code, that is, a puncturing location is randomly or quasi-randomly selected. However, a frame error rate is relatively high and HARQ performance is relatively poor in the prior art.

Therefore, a technology that can improve the HARQ performance is desired.

SUMMARY

Embodiments of the present invention provide a rate matching method and apparatus for a polar code, which can improve HARQ performance.

According to a first aspect, a rate matching method for a polar code is provided, where the method includes: acquiring a congruential sequence according to a code length of a target polar code; performing sorting processing on the congruential sequence according to a preset rule, to acquire a reference sequence; determining a mapping function according to the congruential sequence and the reference sequence; and interleaving the target polar code according to the mapping function, to generate interleaved output bits.

With reference to the first aspect, in another implementation manner of the first aspect, the acquiring a congruential sequence according to a code length of a target polar code includes: determining the congruential sequence according to the following formula:

$x(0) = x_o$ $x(n+1) = [a*x(n)+c] \bmod m, n=0,1,\ldots,(N-2)$, where

N is the code length of the target polar code, and $x_0$, a, c, and m are parameters.

With reference to the first aspect and any implementation manner of the foregoing implementation manners of the first aspect, in another implementation manner of the first aspect, $a=7^5$, $c=0$, $m=2^{31}-1$.

With reference to the first aspect and either implementation manner of the foregoing implementation manners of the first aspect, in another implementation manner of the first aspect, the method further includes: performing order reversing processing on the interleaved output bits.

With reference to the first aspect and any implementation manner of the foregoing implementation manners of the first aspect, in another implementation manner of the first aspect, the method further includes: determining, according to a redundancy version (RV) parameter, a start location, in the interleaved output bits, of a transmit bit transmitted in a hybrid automatic repeat request (HARQ) retransmission.

With reference to the first aspect and any implementation manner of the foregoing implementation manners of the first aspect, in another implementation manner of the first aspect, the method further includes: obtaining, from the interleaved output bits by means of sequential interception or repetition, a transmit bit that needs to be transmitted in a hybrid automatic repeat request (HARQ) retransmission.

According to a second aspect, a rate matching apparatus for a polar code is provided, where the apparatus includes: an acquiring unit configured to acquire a congruential sequence according to a code length of a target polar code; a sorting unit configured to perform sorting processing on the congruential sequence according to a preset rule, to acquire a reference sequence; a determining unit configured to determine a mapping function according to the congruential sequence and the reference sequence; and an interleaving unit configured to interleave the target polar code according to the mapping function, to generate interleaved output bits.

With reference to the second aspect, in another implementation manner of the second aspect, the acquiring unit is configured to acquire the congruential sequence according to the following formula:

$x(0) = x_o$ $x(n+1) = [a*x(n)+c] \bmod m, n=0,1,\ldots,(N-2)$, where

N is the code length of the target polar code, and $x_0$, a, c, and m are parameters.

With reference to the second aspect and any implementation manner of the foregoing implementation manners of the second aspect, in another implementation manner of the second aspect, $a=7^5$, $c=0$, $m=2^{31}-1$.

With reference to the second aspect and either implementation manner of the foregoing implementation manners of the second aspect, the apparatus further includes: an order reversing unit, configured to perform order reversing processing on the interleaved output bits.

With reference to the second aspect and any implementation manner of the foregoing implementation manners of the second aspect, the apparatus further includes: a transmitting unit, configured to determine, according to a redundancy version (RV) parameter, a start location, in the interleaved output bits, of a transmit bit transmitted in a hybrid automatic repeat request (HARQ) retransmission.

With reference to the second aspect and any implementation manner of the foregoing implementation manners of the second aspect, in another implementation manner of the second aspect, the apparatus further includes: a transmitting unit, configured to obtain, from the interleaved output bits by means of sequential interception or repetition, a transmit bit that needs to be transmitted in a hybrid automatic repeat request (HARQ) retransmission.

According to a third aspect, a wireless communications device is provided, where the device includes: a memory configured to store an instruction used to perform the following operations: acquiring a congruential sequence according to a code length of a target polar code; performing sorting processing on the congruential sequence according to a preset rule, to acquire a reference sequence; determining a mapping function according to the congruential sequence and the reference sequence; and interleaving the target polar code according to the mapping function, to generate interleaved output bits; and a processor coupled to the memory and configured to execute the instruction stored in the memory.

With reference to the third aspect, in another implementation manner of the third aspect, the processor determines the congruential sequence according to the following formula:

$$x(0)=x_o$$

$$x(n+1)=[a*x(n)+c] \bmod m, n=0,1, \ldots ,(N-2),$$

where

N is the code length of the target polar code, and $x_0$, a, c, and m are parameters.

With reference to the third aspect and any implementation manner of the foregoing implementation manners of the third aspect, in another implementation manner of the third aspect, $a=7^5$, $c=0$, $m=2^{31}-1$.

With reference to the third aspect and either implementation manner of the foregoing implementation manners of the third aspect, in another implementation manner of the third aspect, the processor performs order reversing processing on the interleaved output bits.

With reference to the third aspect and any implementation manner of the foregoing implementation manners of the third aspect, in another implementation manner of the third aspect, the processor determines, according to a redundancy version (RV) parameter, a start location, in the interleaved output bits, of a transmit bit transmitted in a hybrid automatic repeat request (HARQ) retransmission.

With reference to the third aspect and any implementation manner of the foregoing implementation manners of the third aspect, in another implementation manner of the third aspect, the processor obtains, from the interleaved output bits by means of sequential interception or repetition, a transmit bit that needs to be transmitted in a hybrid automatic repeat request (HARQ) retransmission.

According to the rate matching method and apparatus for a polar code in the embodiments of the present invention, a congruential sequence is determined based on a code length of a polar code, and interleaving of a target polar code is implemented by using the congruential sequence, which can enable a sequence of bits obtained after the interleaving to have a more uniform structure, can reduce a frame error rate and improve HARQ performance, thereby improving reliability of communication; can be applicable to rate matching processes of polar codes of various code lengths, and has good commonality and practicality.

BRIEF DESCRIPTION OF DRAWINGS

To describe the technical solutions in the embodiments of the present invention more clearly, the following briefly introduces the accompanying drawings required for describing the embodiments. Apparently, the accompanying drawings and the following description show merely some embodiments of the present invention, and a person of ordinary skill in the art may still derive other drawings from these accompanying drawings without creative efforts.

DESCRIPTION OF EMBODIMENTS

Currently, multiple embodiments are described with reference to the accompanying drawings in which identical reference numerals are used to denote identical elements in this specification. In the following description, many specific details are provided for ease of explanation, to provide comprehensive understanding of one or more embodiments. However, obviously, the embodiments may also be implemented without these specific details. In another example, a common structure and device are shown in a form of a block diagram, to describe the one or more embodiments.

The terms "component", "module", "system", and the like that are used in this specification are used to represent an entity, hardware, firmware, a combination of hardware and software, software, or software in execution, which is related to a computer. For example, the component may be but is not limited to a process that runs on a processor, a processor, an object, an executable file, an execution thread, a program, and/or a computer. As shown in a figure, both an application that runs on a computing device and the computing device may be components. One or more components may camp on a process and/or an execution thread, and the components may be located on one computer and/or distributed among two or more computers. In addition, these components may be executed on various computer readable media in which various data structures are stored. The components may, for example, perform communication by using a local process and/or a remote process and according to a signal that has one or more data packets (for example, data from two components that interact with another component of a local system, a distributed system, and/or a network, such as the Internet that interacts with another system by using a signal).

In addition, the embodiments are described with reference to an access terminal. The access terminal may also be referred to as a system, a subscriber unit, a subscriber station, a mobile station, a mobile equipment, a remote station, a remote terminal, a mobile device, a user terminal, a terminal, a wireless communications device, a user agent, a user apparatus, or UE (User Equipment). The access terminal may be a cellular phone, a cordless phone, a SIP (Session Initiation Protocol) phone, a WLL (Wireless Local Loop) station, a PDA (Personal Digital Assistant), a handheld device that has a wireless communication function, a computing device, or another processing device connected to a wireless modem. In addition, the embodiments are described with reference to a base station. The base station may be configured to communicate with a mobile device, and the base station may be a BTS (Base Transceiver Station, base transceiver station) in GSM (Global System for Mobile Communications) or CDMA (Code Division Multiple Access), may be a NB (NodeB) in WCDMA (Wideband Code Division Multiple Access), or may be an eNB or eNodeB (evolved Node B) in LTE (Long Term Evolution), a relay station, an access point, a base station device in a future 5G network, or the like.

In addition, aspects or features of the present invention may be implemented as a method, an apparatus, or a product that uses standard programming and/or engineering technologies. The term "product" used in this application covers a computer program that can be accessed from any computer readable component, vehicle, or medium. For example, the computer readable medium may include but is not limited to: a magnetic storage component (such as a hard disk, a floppy disk, or a magnetic tape), an optical disc (such as a CD (Compact Disk), and a DVD (Digital Versatile Disk)), a smart card, and a flash memory component (such as an EPROM (Erasable Programmable Read-Only Memory), a card, a stick, or a key drive)). In addition, various storage media described in this specification may represent one or more devices and/or other machine readable media that are configured to store information. The term "machine readable media" may include but is not limited to a radio channel, and various other media that can store, contain and/or carry an instruction and/or data.

Figure 1:
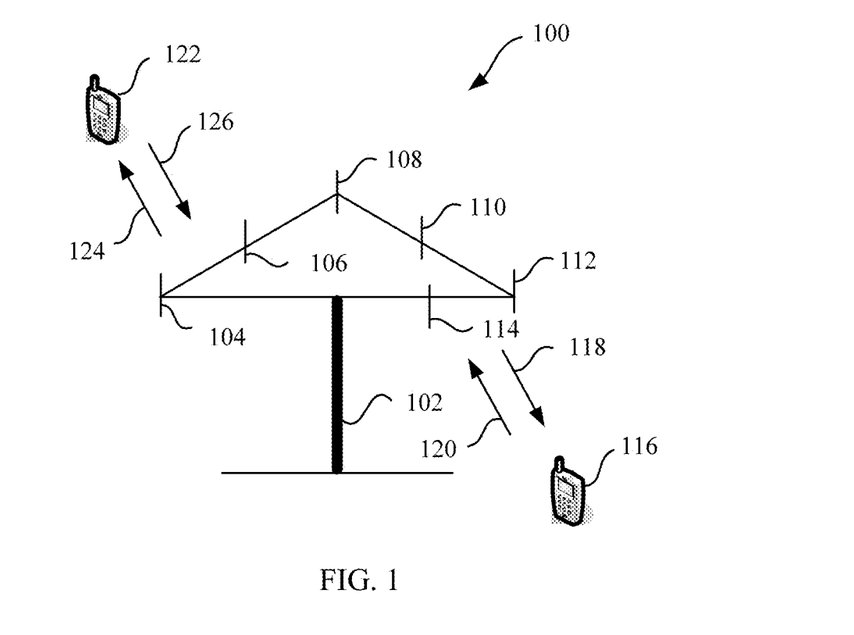
FIG. 1 is a diagram of a wireless communications system according to embodiments described in this specification.

FIG. 1 shows a wireless communications system 100 according to embodiments described in this specification. The wireless communications system 100 includes a base station 102, and the base station 102 may include multiple antenna groups. Each antenna group may include one or more antennas. For example, one antenna group may include antennas 104 and 106, another antenna group may include antennas 108 and 110, and an additional group may include antennas 112 and 114. Two antennas are shown for each antenna group in FIG. 1. However, more or fewer antennas may be used for each group. The base station 102 may additionally include a transmitter chain and a receiver chain, and a person of ordinary skill in the art may understand that both the transmitter chain and the receiver chain may include multiple components (such as a processor, a modulator, a multiplexer, a demodulator, a demultiplexer, and an antenna) related to signal sending and receiving.

The base station 102 may communicate with one or more access terminals (such as an access terminal 116 and an access terminal 122). However, it may be understood that the base station 102 may communicate with any quantity of access terminals similar to the access terminal 116 or 122. Access terminals 116 and 122 may be, for example, cellular phones, smart phones, portable computers, handheld communication devices, handheld computing devices, satellite radio apparatuses, Global Positioning Systems, PDAs, and/or any other proper device configured to perform communication in the wireless communications system 100. As shown in the figure, the access terminal 116 communicates with the antennas 112 and 114, where the antennas 112 and 114 send information to the access terminal 116 over a forward link 118, and receive information from the access terminal 116 over a reverse link 120. In addition, the access terminal 122 communicates with the antennas 104 and 106, where the antennas 104 and 106 send information to the access terminal 122 over a forward link 124, and receive information from the access terminal 122 over a reverse link 126. In an FDD (Frequency Division Duplex) system, for example, the forward link 118 may use a frequency band different from that used by the reverse link 120, and the forward link 124 may use a frequency band different from that used by the reverse link 126. In addition, in a TDD (Time Division Duplex) system, the forward link 118 and the reverse link 120 may use a same frequency band, and the forward link 124 and the reverse link 126 may use a same frequency band.

Each antenna group and/or area designed for communication is referred to as a sector of the base station 102. For example, an antenna group may be designed to communicate with an access terminal in a sector of a coverage area of the base station 102. In a process in which the base station 102 communicates with the access terminals 116 and 122 by using the forward links 118 and 124 respectively, a transmit antenna of the base station 102 may improve signal-to-noise ratios of the forward links 118 and 124 by means of beamforming. In addition, in comparison with a manner of sending, by a base station, a signal to all access terminals of the base station by using a single antenna, when the base station 102 sends, by means of beamforming, a signal to the access terminals 116 and 122 randomly distributed in a related coverage area, a mobile device in a neighboring cell suffers less interference.

In a specified time, the base station 102, the access terminal 116, or the access terminal 122 may be a wireless communications sending apparatus and/or a wireless communications receiving apparatus. Before sending data, the wireless communications sending apparatus may encode the data for transmission. Specifically, the wireless communications sending apparatus may acquire (for example, generate; receive from another communications device; or store to a memory) a specific quantity of data bits to be sent to the wireless communications receiving apparatus through a channel. The data bit may be contained in a transport block (or multiple transport blocks) of data, and the transport block may be segmented to generate multiple code blocks. In addition, the wireless communications sending apparatus may encode each code block by using a Polar encoder (not shown).

Figure 2:
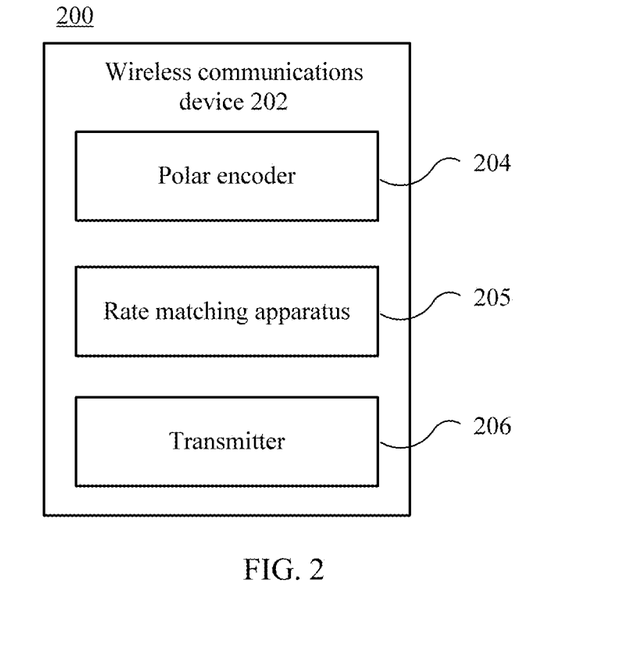
FIG. 2 is a diagram of a system for performing a rate matching method for a polar code in a wireless communications environment.

FIG. 2 shows a schematic block diagram of a system 200 applicable to a rate matching method for a polar code in a wireless communications environment. The system 200 includes a wireless communications device 202, and it is shown that the wireless communications device 202 sends data through a channel. Although it is shown that the wireless communications device 202 sends data, the wireless communications device 202 may further receive data through a channel (for example, the wireless communications device 202 may send and receive data at the same time, the wireless communications device 202 may send and transmit data at different moments, or a combination thereof). The wireless communications device 202 may be, for example, a base station (such as the base station 102 in FIG. 1) or an access terminal (such as the access terminal 116 in FIG. 1 or the access terminal 122 in FIG. 1).

The wireless communications device 202 may include a Polar code encoder 204, a rate matching apparatus 205, and a transmitter 206. Optionally, when the wireless communications device 202 receives data through a channel, the wireless communications device 202 may further include a receiver, where the receiver may exit independently, or may be integrated with the transmitter 206 to form a transceiver.

The Polar code encoder 204 is configured to encode data to be transmitted from the wireless communications device 202, to obtain a target polar code.

The rate matching apparatus 205 is configured to: acquire a congruential sequence according to a code length of the target polar code output by the polar encoder 204; perform sorting processing on the congruential sequence according to a preset rule, to acquire a reference sequence; determine a mapping function according to the congruential sequence and the reference sequence; and interleave the target polar code according to the mapping function, to generate interleaved output bits.

In addition, the transmitter 206 may subsequently transmit, through a channel, the output bits that are obtained after the rate matching apparatus 205 performs processing. For example, the transmitter 206 may send related data to another wireless communications device (not shown).

The following describes in detail a specific processing process of the foregoing rate matching apparatus.

Figure 3:
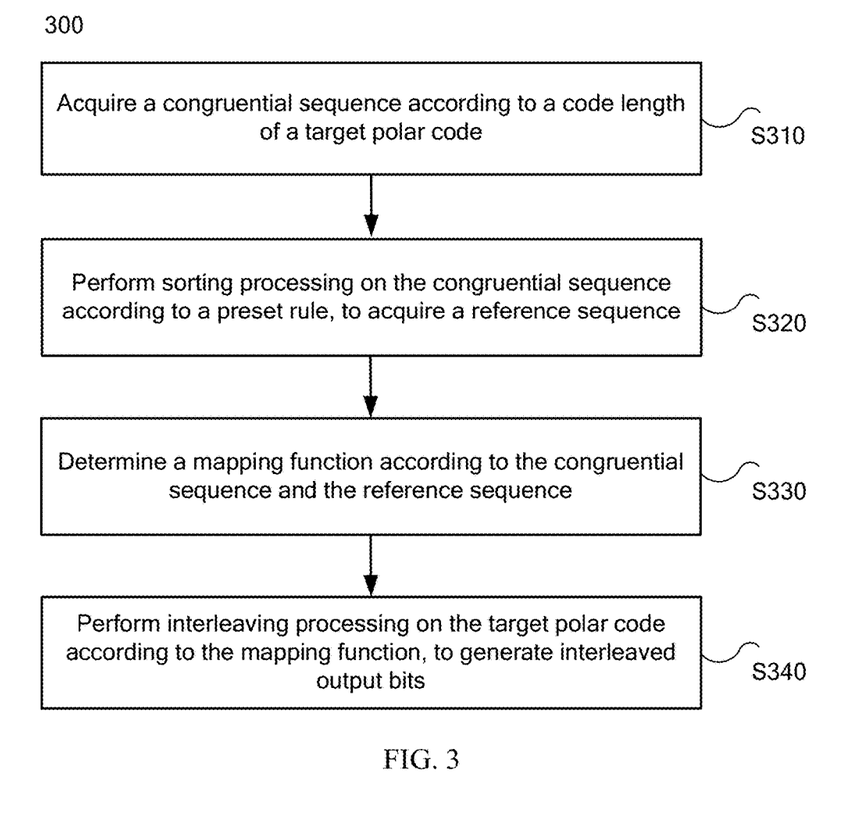
FIG. 3 is a flowchart of a rate matching method for a polar code according to an embodiment.

FIG. 3 is a schematic flowchart of a rate matching method 300 for a polar code according to an embodiment. The method 300 shown in FIG. 3 may be performed by a rate matching apparatus (such as an interleaver) in a wireless communications device, and the method 300 includes:

S310. Acquire a congruential sequence according to a code length of a target polar code.

S320. Perform sorting processing on the congruential sequence according to a preset rule, to acquire a reference sequence.

S330. Determine a mapping function according to the congruential sequence and the reference sequence.

S340. Interleave the target polar code according to the mapping function, to generate interleaved output bits.

Specifically, in S310, a transmit end may perform, by using, for example, a Polar encoder, Polar encoding processing on information that needs to be sent to a receive end, to generate a polar code (that is, the target polar code). The polar code is a linear block code, and is an encoding manner in which it has been theoretically proved that the polar code can obtain a Shannon capacity, with low coding and decoding complexity. Encoding output of the Polar code may be represented as:

$$x_1^N = u_1^N G_N,$$

where $u_1^N = \{u_1, u_2, \ldots, u_N\}$ is a binary row vector whose length is N; $G_N$ is an N*N matrix, $G_N = B_N F^{\otimes n}$, a code length N=2, and n≥0; herein, $$F = \begin{bmatrix} 1 & 0 \\ 1 & 1 \end{bmatrix},$$

where $B_N$ is a transpose matrix, and $F^{\otimes n}$ is a kronecker power (kronecker power) and is defined as:

$$F^{\otimes n} = F \otimes F^{\otimes(n-1)}.$$

In a process of encoding the Polar code, some bits in $u_1^N$ are used to carry information (that is, data information that needs to be sent to the receive end), the bits are referred to as information bits, and a set of indexes of these bits is marked as A; and the remaining bits are fixed values and are referred to as frozen values, and for example, may be always set to 0.

Therefore, a bit sequence of a Polar code output after the encoding processing of the Polar code encoder may be simplified as: $x_1^N = u_A G_N(A)$, where $u_A$ is a set of information bits in $U_1^N$, $u_A$ is a row vector of a length K, and K is a quantity of information bits. $G_N^{(A)}$ is a submatrix obtained by using rows corresponding to the indexes in the set A, and $G_N(A)$ is a K*N matrix. Selection of the set A determines performance of the Polar code.

It should be understood that the process of acquiring the Polar code described above is merely an exemplary description, and the present invention is not limited thereto. Another method of obtaining, by performing encoding processing on information, a bit sequence that has a Polar code feature falls within the protection scope of the present invention.

Then, the congruential sequence may be determined according to a code length of the Polar code determined above.

Optionally, the acquiring a congruential sequence according to a code length of a target polar code includes:

determining the congruential sequence according to the following formula:

$$x(0) = x_o$$

$$x(n+1) = [a*x(n)+c] \bmod m, n=0, \ldots, (N-2),$$

where

N is the code length of the target polar code, and $x_0$, a, c, and m are parameters.

Specifically, it is assumed that M is a specified positive integer, and if remainders obtained after two integers A and B are divided by M are the same, it is called that A is congruent to B modulo M.

A linear congruential method may be represented as the following formula 1:

$$x(0) = x_o$$

$$x(n+1) = [a*x(n)+c] \bmod m, n=0,1, \ldots, (N-2) \quad \text{Formula 1,}$$

where m represents a modulo, and 0<m; a represents a multiplier; c represents an increment; and x(0) represents an initial value.

Optionally, in this embodiment of the present invention, $x_0 = 4831$ $a = 7^5$, $c = 0$, and $m = 2^{31} - 1$.

Specifically, tests show that when $x_0 = 4831$, $a = 7^5$, $c = 0$, and $m = 2^{31} - 1$, a random number (32 bits) from 0 to $2^{31} - 1$ can be produced, a better probability statistical feature can be obtained for the congruential sequence, and randomness of the congruential sequence can be improved.

Therefore, in this embodiment of the present invention, the congruential sequence may be generated based on matlab by using the following program:

function [seq_x]=multiplieCongru_interg (length, initial); Statement 1
  seq_x(1)=initial; Statement 2
  a=7^5; Statement 3
  c=0; Statement 4
  m=2^31-1; Statement 5
  for k=1: (length-1); Statement 6
  seq_x(k+1)=mod(a*seq_x(k)+c, m); Statement 7
  end Specific notes of this program are as follows:

Statement 1: Define a function multiplieCongru_interg for implementing the congruential sequence, where a return value of the function is seq_x; initial is an initial value of the congruential sequence and is an input parameter of the function; and length is a quantity of elements in the congruential sequence, that is, length=N, where N is a code length of a polar code.

Statement 2: Define the first element in the congruential sequence, that is, seq_x(1), as a preset initial value.
Statement 3: Define a parameter $a=7^5$.
Statement 4: Define a parameter c=0.
Statement 5: Define a parameter $m=2^{31}-1$.
Statement 6: Define a value range of k as [1, length-1].
Statement 7: Define that seq_x(k+1) is a*seq_x(k)+c modulo m.

It should be noted that because a sequence number of an array in matlab starts from 1, sequence numbers of pseudocodes in matlab are from 1 to N.

Then, in S320, the transmit end may perform, in ascending order (an example of the preset rule), sorting processing on the congruential sequence determined above. In this embodiment of the present invention, for example, the foregoing sorting processing may be performed by using a sort function, where the sort function may be represented as sort ([first,last]), that is, elements in the [first,last] are sorted in ascending order.

Therefore, in this embodiment of the present invention, the congruential sequence generated above may be sorted based on matlab by using the following program:
st2=4831;
[seq_x]=multiplieCongru_interg(N,st2);
[ign, p]=sort(seq_x);
Interleaver_RM=p.

Therefore, a congruential sequence obtained after the foregoing sorting processing may be used as the reference sequence.

Therefore, in S330, the mapping function is determined according to the congruential sequence obtained in S310 and the reference sequence obtained in S320. Specifically, in S320, sorting processing is performed on elements in the congruential sequence, and therefore, the foregoing mapping function may be determined according to locations, in the congruential sequence and the reference sequence, of the elements.

As an example instead of a limitation, if a sequence A is [0, 7, 1], a sequence B obtained after order ascending processing is performed on the sequence A is [0, 1, 7], and therefore, a mapping rule (or a mapping function) p from the sequence A to the sequence B may be represented as [0, 2, 1], that is, the first element (whose sequence number is 0) of the sequence B is the first element (whose sequence number is 0) of the sequence A, the second element (whose sequence number is 1) of the sequence B is the third element (whose sequence number is 2) of the sequence A, and the third element (whose sequence number is 2) of the sequence B is the second element (whose sequence number is 1) of the sequence A.

Likewise, the mapping function may be obtained according to the reference sequence and the congruential sequence that are obtained above.

Therefore, in S340, the target polar code obtained in S310 may be interleaved based on the mapping function obtained above.

As an example instead of a limitation, if the mapping function p is [0, 2, 1], a bit value of the first bit (whose sequence number is 0) of a sequence of bits obtained after the interleaving is a bit value of the first bit (whose sequence number is 0) of a sequence of bits that exists before the interleaving processing, a bit value of the second bit (whose sequence number is 1) of the sequence of the bits obtained after the interleaving processing is a bit value of the third bit (whose sequence number is 2) of the sequence of the bits that exists before the interleaving processing, and a bit value of the third bit (whose sequence number is 2) of the sequence of the bits obtained after the interleaving processing is a bit value of the second bit (whose sequence number is 1) of the sequence of the bits that exists before the interleaving processing.

Optionally, the method 300 further includes:
performing order reversing processing on the output bits obtained after the interleaving processing.

Specifically, after a sequence of the output bits obtained after the interleaving processing is obtained in S340, order reversing processing may be performed on the sequence of the bits. For example, if the bits obtained after the interleaving are represented as $\{a_0, a_1, \ldots, a_{N-1}\}$, bits obtained after the order reversing processing may be represented as $\{a_{N-1}, a_{N-2}, a_1, a_0\}$.

Optionally, the method 300 further includes:
determining, according to a redundancy version RV parameter, a start location, in the interleaved output bits, of a transmit bit transmitted in hybrid automatic repeat request HARQ retransmission.

Specifically, after interleaving (or interleaving and order reversing processing), for example, the output bits may be sent to a Circular Buffer (circular buffer), a start location, in the Circular Buffer, of a bit in retransmission this time is determined according to an RV (Redundancy Version, redundancy version) parameter corresponding to current HARQ retransmission, and a length of the bit in retransmission this time may be determined according to a transmission resource or a preset rule, and therefore, a bit that needs to be sent in the current HARQ retransmission or an output bit obtained after rate matching processing may be determined.

Alternatively, optionally, the method 300 further includes:
obtaining, from the interleaved output bits by means of sequential interception or repetition, a transmit bit that needs to be transmitted in HARQ retransmission.

Figure 4A:
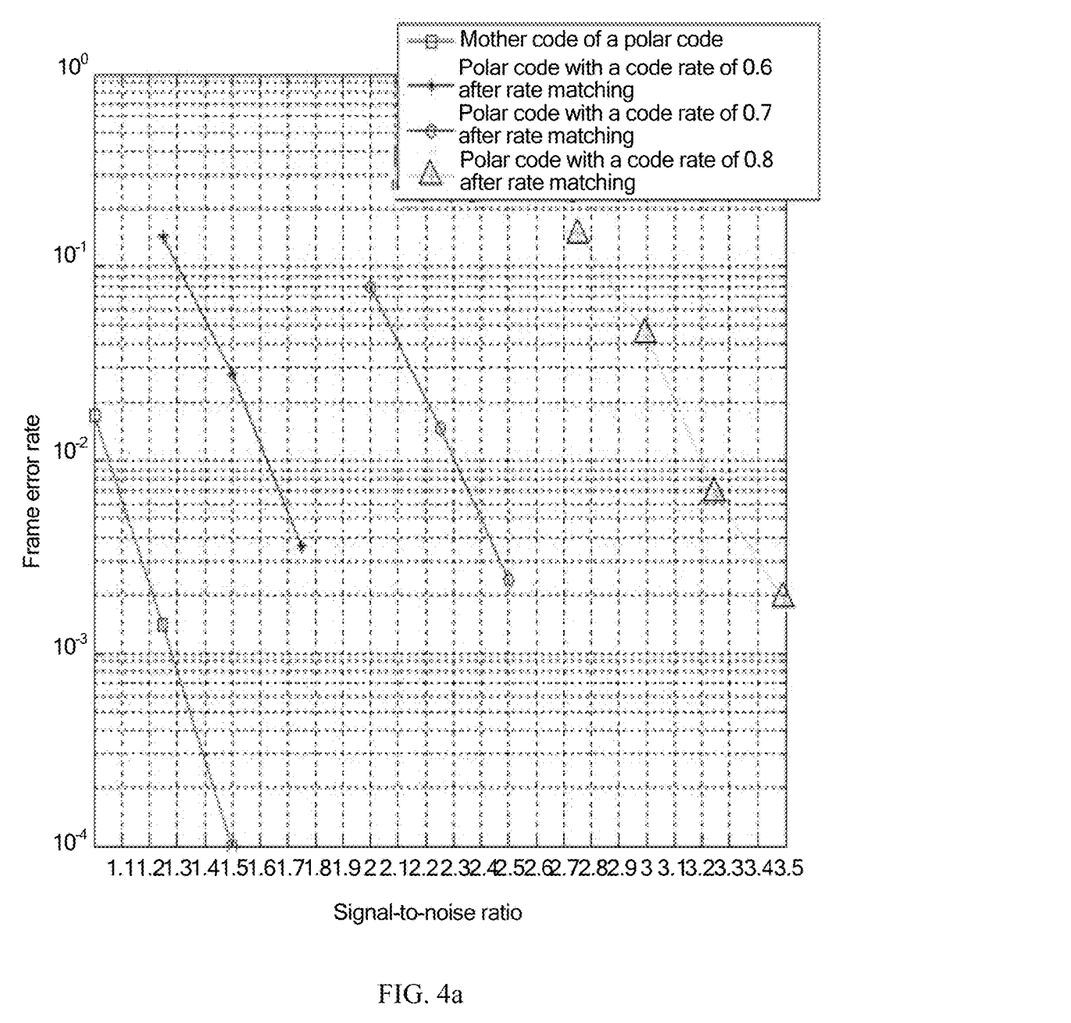
FIG. 4a and FIG. 4b are schematic diagrams of emulation results of rate matching performance of polar codes obtained after processing has been performed.
Figure 4B:
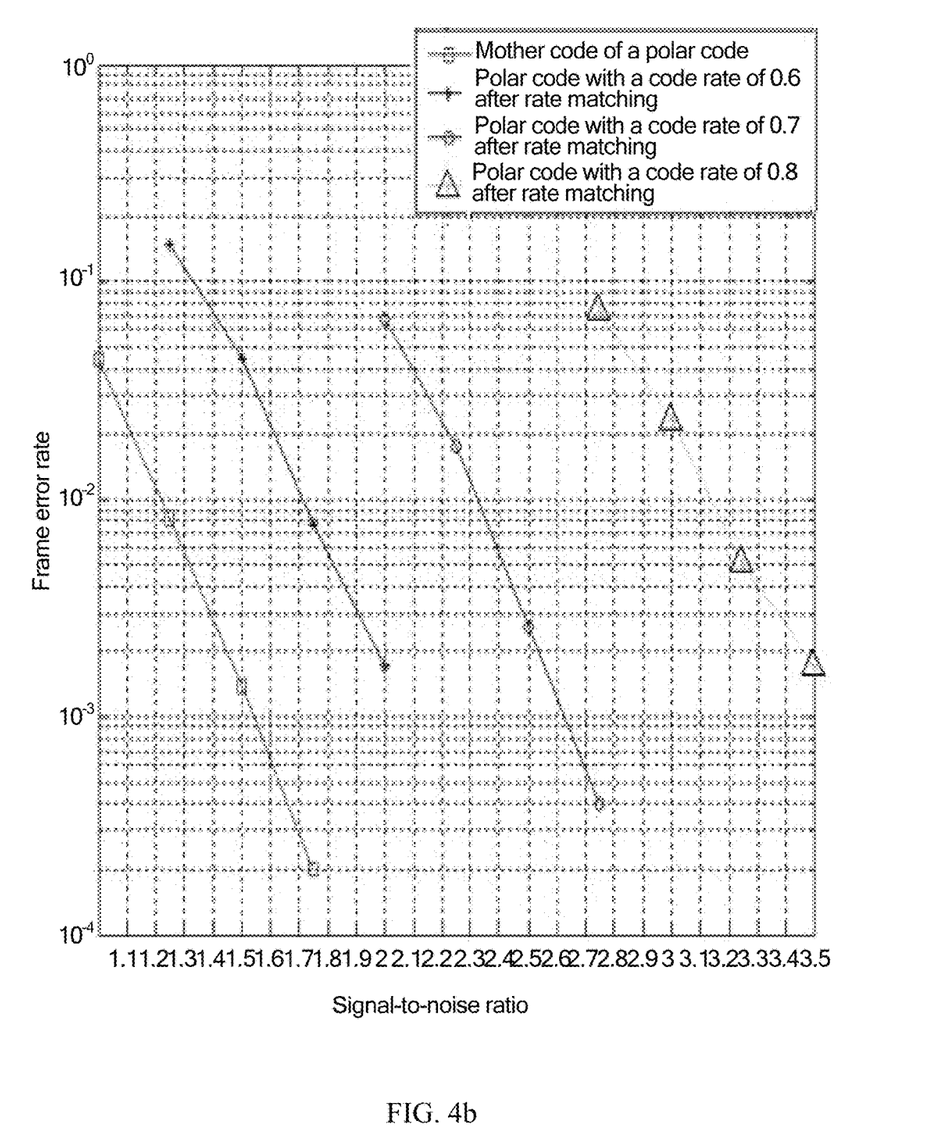

Specifically, a start location, in the output bits obtained after the interleaving processing (or interleaving and order reversing processing), of a bit sent in each time of HARQ transmission, and therefore, the bit in each time of retransmission may be determined by means of sequential interception or repetition. FIG. 4a and FIG. 4b are schematic diagrams of emulation results of rate matching performance of polar codes obtained after processing has been performed. FIG. 4a shows rate matching performance of a polar code whose code length is 2048 and information bit length is 1024, and FIG. 4b shows rate matching performance of a polar code whose code length is 1024 and information bit length is 512. As shown in FIG. 4a and FIG. 4b, rate matching performance of a polar code (obtained after processing is performed by using the rate matching method for a polar code) is better.

The following Table 1 shows rate matching performance of a polar code and a Turbo code in a case in which a code length is 2048 and an information bit length is 1024, where an information bit includes a 24-bit CRC (Cyclic Redundancy Check, cyclic redundancy check), and P represents a quantity of bits removed by means of puncturing.

TABLE 1

|  | Code rate R = 0.5 | Code rate R = 0.6 (P = 341) | Code rate R = 0.7 (P = 585) | Code rate R = 0.8 (P = 768) |
|---|---|---|---|---|
| Signal-to-noise ratio of Polar code (dB) | 1.05 | 1.6 | 2.3 | 3.2 |
| Signal-to-noise ratio of | 1.45 | 2 | 2.6 | 3.35 |

TABLE 1-continued

| | Code rate R = 0.5 | Code rate R = 0.6 (P = 341) | Code rate R = 0.7 (P = 585) | Code rate R = 0.8 (P = 768) |
|---|---|---|---|---|
| Turbo code (dB) | | | | |
| Gain of Polar code relative to Turbo code (dB) | 0.4 | 0.4 | 0.3 | 0.15 |

The following Table 2 shows rate matching performance of a polar code and a Turbo code in a case in which a code length is 1024 and an information bit length is 512, where an information bit includes a 24-bit CRC.

TABLE 2

| | Code rate R = 0.5 | Code rate R = 0.6 (P = 171) | Code rate R = 0.7 (P = 293) | Code rate R = 0.8 (P = 384) |
|---|---|---|---|---|
| Signal-to-noise ratio of Polar code (dB) | 1.25 | 1.7 | 2.3 | 3.15 |
| Signal-to-noise ratio of Turbo code (dB) | 1.7 | 2.25 | 2.9 | 3.6 |
| Gain of Polar code relative to Turbo code (dB) | 0.45 | 0.55 | 0.6 | 0.45 |

As shown in FIG. 4a and FIG. 4b, in a case in which code lengths are the same, information bit lengths are the same, and code rates are the same, rate matching performance of a polar code obtained after processing is performed by using the processing method for a polar code of the present invention is obviously better than rate matching performance of a Turbo code.

According to the rate matching method for a polar code in this embodiment of the present invention, a congruential sequence is determined based on a code length of a polar code, and interleaving of a target polar code is implemented by using the congruential sequence, which can enable a sequence of bits obtained after the interleaving to have a more uniform structure, can reduce a frame error rate and improve HARQ performance, thereby improving reliability of communication; can be applicable to rate matching processes of polar codes of various code lengths, and has good commonality and practicality.

Figure 5:
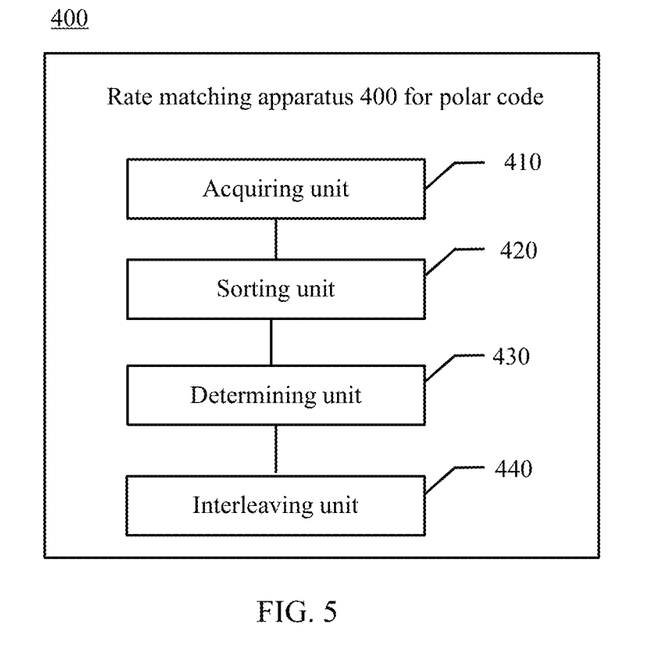
FIG. 5 is a structural block diagram of a rate matching apparatus for a polar code according to an embodiment of the present invention.

With reference to FIG. 1 and FIG. 4, the foregoing describes in detail the rate matching method for a polar code according to the embodiments of the present invention, and with reference to FIG. 5, the following describes in detail a rate matching apparatus for a polar code according to an embodiment.

FIG. 5 is a schematic block diagram of a rate matching apparatus 400 for a polar code according to an embodiment. The rate matching apparatus 400 for a polar code in FIG. 5 includes:

an acquiring unit 410, configured to acquire a congruential sequence according to a code length of a target polar code;

a sorting unit 420, configured to perform sorting processing on the congruential sequence according to a preset rule, to acquire a reference sequence;

a determining unit 430, configured to determine a mapping function according to the congruential sequence and the reference sequence; and an interleaving unit 440, configured to interleave the target polar code according to the mapping function, to generate interleaved output bits.

Optionally, the acquiring unit 410 is specifically configured to acquire the congruential sequence according to the following formula:

$$x(0)=x_o$$

$$x(n+1)=[A*x(n)+c] \mod m, \ n=0,1,\ldots,(N-2),$$

where

N is the code length of the target polar code, and $x_0$, a, c, and m are parameters.

Optionally, $a=7^5$, $c=0$, $=2^{31}-1$.

Optionally, the apparatus 400 further includes:

an order reversing unit, configured to perform order reversing processing on the interleaved output bits.

Optionally, the apparatus 400 further includes:

a transmitting unit, (not shown) configured to determine, according to a redundancy version RV parameter, a start location, in the interleaved output bits, of a transmit bit transmitted in hybrid automatic repeat request HARQ retransmission.

Optionally, the apparatus 400 further includes:

a transmitting unit, (not shown) configured to obtain, from the interleaved output bits by means of interception or repetition, a transmit bit that needs to be transmitted in HARQ retransmission.

The rate matching apparatus 400 for a polar code according to this embodiment of the present invention may be corresponding to an execution body of the rate matching method 300 for a polar code in the embodiments of the present invention, and units in the rate matching apparatus 400 for a polar code and the foregoing other operations and/or functions used to implement a corresponding procedure of the method 300 in FIG. 3. For brevity, details are not described herein again.

In addition, the rate matching apparatus for a polar code may include a rate matching device, and the rate matching device includes functions of the acquiring unit 410, the sorting unit 420, the determining unit 430, and the interleaving unit 440.

According to the rate matching apparatus for a polar code in this embodiment of the present invention, a congruential sequence is determined based on a code length of a polar code, and interleaving of a target polar code is implemented by using the congruential sequence, which can enable a sequence of bits obtained after the interleaving to have a more uniform structure, can reduce a frame error rate and improve HARQ performance, thereby improving reliability of communication; can be applicable to rate matching processes of polar codes of various code lengths, and has good commonality and practicality.

Figure 6:
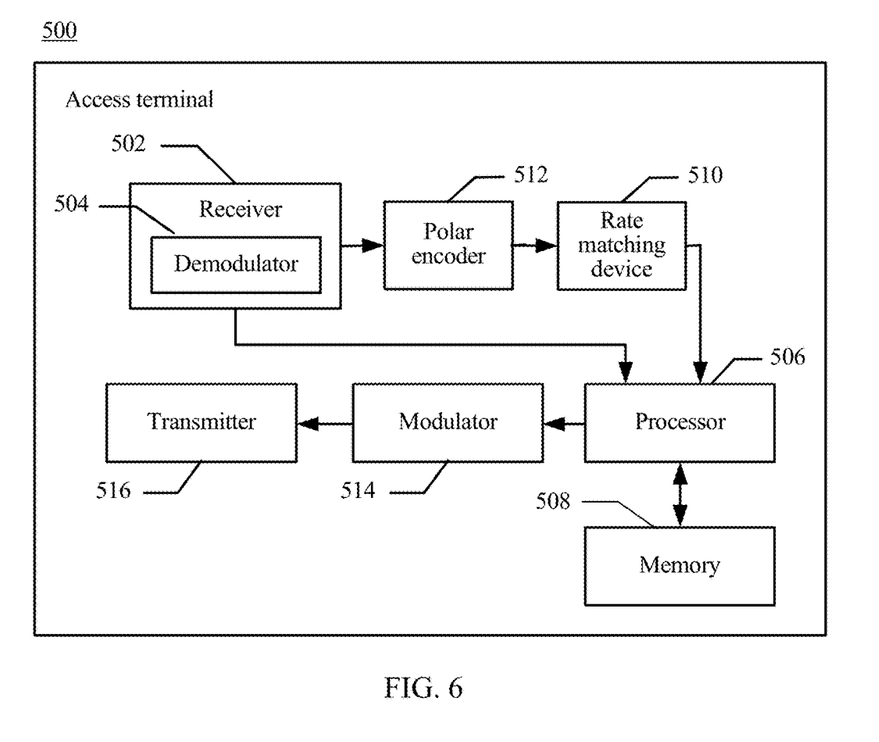
FIG. 6 is a diagram of an exemplary access terminal for performing a rate matching for a polar code in a wireless communications environment.

FIG. 6 is a diagram of an access terminal 500 for performing method rate matching for a polar code in a wireless communications environment. The access terminal 500 includes a receiver 502, and the receiver 502 is configured to: receive a signal from, for example, a receive antenna (not shown), perform a typical action (such as filtering, amplifying, or down-conversion) on the received signal, and digitize a signal obtained after the adjustment to obtain a sample. The receiver 502 may be, for example, an MMSE (minimum mean square error, Minimum Mean-Squared Error) receiver. The access terminal 500 may further include a demodulator 504, and the demodulator 504 may be configured to demodulate a received signal and provide the demodulated signal to a processor 506 for channel estimation. The processor 506 may be a processor specially configured to analyze information received by the receiver 502 and/or generate information sent by a transmitter 516; a processor configured to control one or more components of the access terminal 500; and/or a controller configured to analyze a signal received by the receiver 502, generate information sent by a transmitter 516, and control one or more components of the access terminal 500.

The access terminal 500 may additionally include a memory 508, and the latter is operatively coupled to the processor 506 and stores the following data: to-be-sent data, received data, and any other proper information related to implementing various actions and functions that are described in this specification. The memory 508 may additionally store a protocol and/or an algorithm related to processing of a polar code.

It may be understood that a data storage apparatus (such as the memory 508) described in this specification may be a volatile memory or a nonvolatile memory; or may include both a volatile memory and a nonvolatile memory. As an example instead of a limitation, the nonvolatile memory may include: a ROM (Read-Only Memory), a PROM (Programmable ROM), an EPROM (Erasable PROM, erasable programmable read-only memory), an EEPROM (Electrically EPROM, electrically erasable programmable read-only memory), or a flash memory. The volatile memory may include a RAM (Random Access Memory), and the RAM is used as an external cache. As an exemplary rather than limited description, RAMs in many forms, such as an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory), an SLDRAM (Synchlink DRAM, synchlink dynamic random access memory), and a DR RAM (Direct Rambus RAM, direct Rambus random access memory), are available. The memory 508 in the system and the method that are described in this specification is aimed at including but being not limited to these memories and any other memories of proper types.

In an actual application, the receiver 502 may further be coupled to a rate matching device 510, which may be basically similar to the rate matching apparatus 205 in FIG. 2. In addition, the access terminal 500 may include: a polar code encoder 512, which is basically similar to the polar code encoder 204 in FIG. 2. The rate matching device 510 may be configured to: acquire a congruential sequence according to a code length of a target polar code obtained after polar code encoding processing performed by the polar encoder 512; perform sorting processing on the congruential sequence according to a preset rule, to acquire a reference sequence; determine a mapping function according to the congruential sequence and the reference sequence; and perform interleaving processing on the target polar code according to the mapping function, to generate output bits obtained after the interleaving processing.

Optionally, in an embodiment, the rate matching device 510 is further configured to determine the congruential sequence according to the following formula:

$$x(0)=x_o$$

$$x(n+1)=[a^*x(n)+c] \bmod m \; n=0,1,\ldots,(N-2),$$

where

N is the code length of the target polar code, and $x_0$, a, c, and m are parameters.

Optionally $x_0=4831$, $a=7^5$, $c=0$, and $m=2^{31}-1$.

Optionally, in another embodiment, the rate matching device 510 is further configured to perform order reversing processing on the interleaved output bits.

Optionally, in another embodiment, the rate matching device 510 is further configured to determine, according to a redundancy version RV parameter, a start location, in the interleaved output bits, of a transmit bit transmitted in hybrid automatic repeat request HARQ retransmission.

Optionally, in another embodiment, the rate matching device 510 is further configured to obtain, from the interleaved output bits by means of sequential interception or repetition, a transmit bit that needs to be transmitted in HARQ retransmission.

In addition, the access terminal 500 may further include a modulator 514 and the transmitter 516, and the transmitter 516 is configured to send a signal to, for example, a base station or another access terminal. Although it is shown that the polar code encoder 512, the rate matching device 510, and/or the modulator 514 are separated from the processor 506, it may be understood that the polar code encoder 512, the rate matching device 510, and/or the modulator 514 may be parts or a part of the processor 506 or multiple processors (not shown). In an actual application, the receiver 502 and the transmitter 516 may also be integrated to form a transceiver.

A congruential sequence is determined based on a code length of a polar code, and interleaving of a target polar code is implemented by using the congruential sequence, which can enable bits obtained after the interleaving to have a more uniform structure, can reduce a frame error rate and improve HARQ performance, thereby improving reliability of communication; can be applicable to rate matching processes of polar codes of various code lengths, and has good commonality and practicality.

Figure 7:
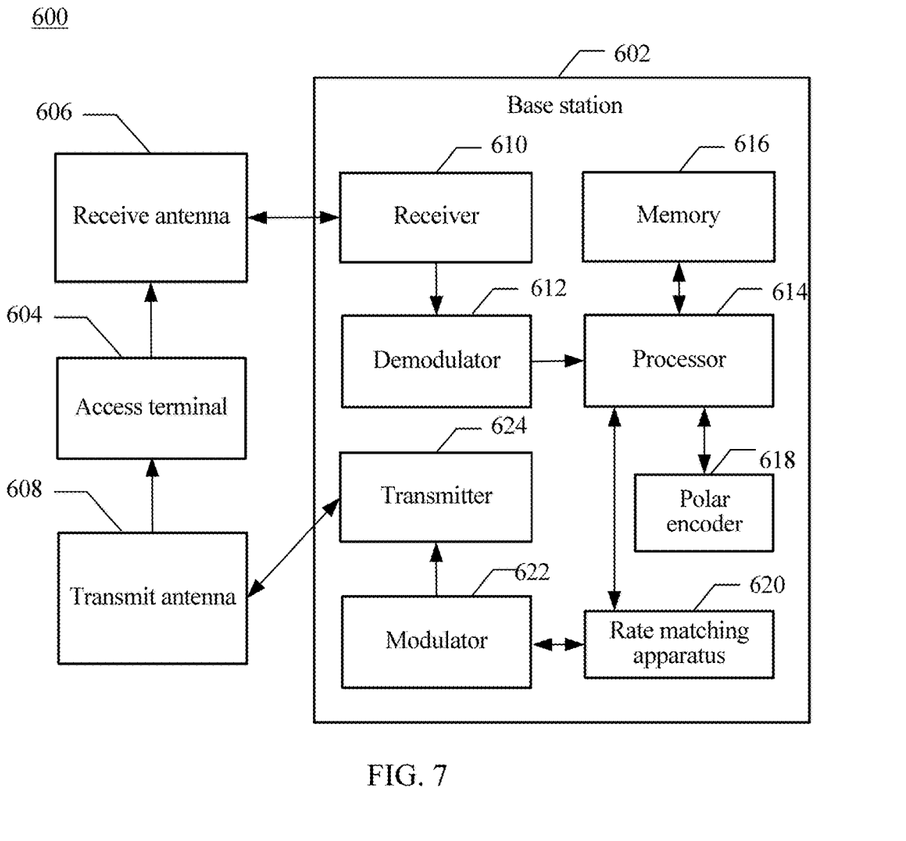
FIG. 7 is a diagram of an exemplary system for performing a rate matching for a polar code in a wireless communications environment.

FIG. 7 is a diagram of a system 600 for performing method rate matching for a polar code in a wireless communications environment. The system 600 includes a base station 602 (such as an access point, an NB, or an eNB), and the base station 602 has a receiver 610 that receives signals from one or more access terminals 604 by using multiple receive antennas 606, and a transmitter 624 that transmits a signal to one or more access terminals 604 by using a transmit antenna 608. Generally, a "receive antenna" and a "transmit antenna" may be integrated to form a receive/transmit antenna. The receiver 610 may receive information from the receive antennas 606, and is operatively associated with a demodulator 612 that demodulates the received information. A demodulated symbol is analyzed by using a processor 614, and the processor 614 is connected to a memory 616. The memory 616 is configured to store data to be sent to the access terminals 604 (or different base stations (not shown)), data received from the access terminals 604 (or different base stations (not shown)), and/or any other proper information related to implementing actions and functions that are described in this specification. The processor 614 may further be coupled to a Polar encoder 618 and a rate matching apparatus 620, and the rate matching apparatus 620 may be configured to: acquire a congruential sequence according to a code length of a target polar code obtained after polar code encoding processing performed by the polar encoder 618; perform sorting processing on the congruential sequence according to a preset rule, to acquire a reference sequence; determine a mapping function according to the congruential sequence and the reference sequence; and perform interleaving processing on the target polar code according to the mapping function, to generate interleaved output bits.

Optionally, in an embodiment, the rate matching apparatus 620 is further configured to determine the congruential sequence according to the following formula:

$$x(0)=x_o$$

$$x(n+1)=[a*x(n)+c] \bmod m, n=0,1,\ldots,(N-2),$$

where

N is the code length of the target polar code, and $x_0$, a, c, and m are parameters.

Optionally, $x_0=4831$, $a=7^5$, $c=0$, and $m=2^{31}-1$.

Optionally, in another embodiment, the rate matching apparatus 620 is further configured to perform order reversing processing on the interleaved output bits.

Optionally, in another embodiment, the rate matching apparatus 620 is further configured to determine, according to a redundancy version RV parameter, a start location, in the interleaved output bits, of a transmit bit transmitted in hybrid automatic repeat request HARQ retransmission.

Optionally, in another embodiment, the rate matching apparatus 620 is further configured to obtain, from the interleaved output bits by means of sequential interception or repetition, a transmit bit that needs to be transmitted in HARQ retransmission.

In addition, the access terminal 600 may further include a modulator 622 and the transmitter 624, and the transmitter 624 is configured to send a signal to, for example, a base station or another access terminal. Although it is shown that the polar encoder 618, the rate matching device 620, and/or the modulator 622 are separated from the processor 614, it may be understood that the polar code encoder 616, the rate matching device 620, and/or the modulator 622 may be parts or a part of the processor 614 or multiple processors (not shown).

In addition, in the system 600, the modulator 622 may modulate frames, and the transmitter 624 sends frames modulated by the modulator 622 to the access terminals 604 by using the antennas 606. Although it is shown that the Polar encoder 618, the rate matching device 620, and/or the modulator 622 are separated from the processor 614, it may be understood that the Polar encoder 618, the rate matching device 620, and/or the modulator 622 may be parts or a part of the processor 614 or multiple processors (not shown).

It may be understood that these embodiments described in this specification may be implemented by using hardware, software, firmware, middleware, a microcode, or a combination thereof. For hardware implementation, a processing unit may be implemented in other electronic units or a combination thereof configured to implement the functions described in this specification, such as one or more ASICs (Application Specific Integrated Circuits, application-specific integrated circuit), DSPs (Digital Signal Processing), DSPDs (DSP Device, digital signal processing device), PLDs (Programmable Logic Device), FPGAs (Field-Programmable Gate Array), processors, controllers, microcontrollers, microprocessors, or chips.

When the embodiments are implemented in software, firmware, middleware, a microcode, program code, or a code segment, the software, the firmware, the middleware, the microcode, the program code, and the code segment may be stored in, for example, a machine readable medium of a storage component. The code segment may represent any combination of a process, a function, a subprogram, a program, a routine, a subroutine, a module, a software group, a class, an instruction, a data structure, or a program statement. The code segment may be coupled to another code segment or a hardware circuit by transmitting and/or receiving information, data, an independent variable, a parameter, or storage content. The information, the independent variable, the parameter, the data, and the like may be transferred, forwarded, or sent in any proper manner including memory sharing, message transfer, token transfer, network transmission, and the like.

For software implementation, the technologies described in this specification may be implemented by using modules that implement the functions (such as a process and a function) described in this specification. Software code may be stored in a memory and be executed by using a processor. A storage unit may be implemented in a processor or outside a processor, and in the latter case, the storage unit may be coupled to the processor in a communication manner by using various means known in the art.

A congruential sequence is determined based on a code length of a polar code, and interleaving of a target polar code is implemented by using the congruential sequence, which can enable a sequence of bits obtained after the interleaving to have a more uniform structure, can reduce a frame error rate and improve HARQ performance, thereby improving reliability of communication; can be applicable to rate matching processes of polar codes of various code lengths, and has good commonality and practicality.

Figure 8:
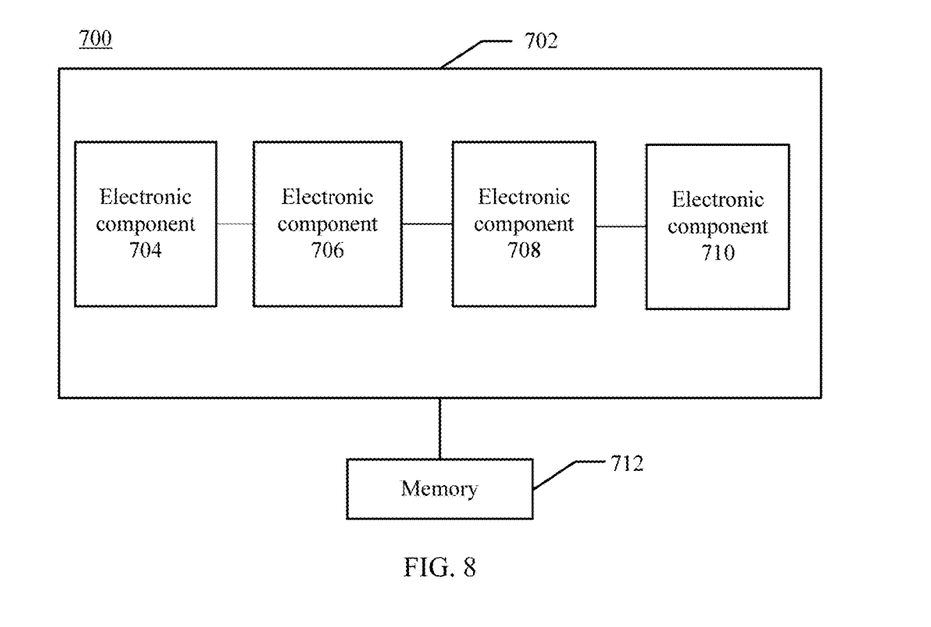
FIG. 8 is a diagram of an exemplary system for a rate matching for a polar code in a wireless communications environment.

FIG. 8 shows a system 700 for a rate matching for a polar code in a wireless communications environment. For example, the system 700 may at least partially camp on a base station. According to another example, the system 700 may at least partially camp on an access terminal. It should be understood that the system 700 may be represented as including function blocks, where the function blocks may be function blocks that represent functions implemented by a processor, software, or a combination thereof (such as firmware). The system 700 includes a logical group 702 in which electronic components jointly operate. For example, the logical group 702 may include an electronic component 704 configured to acquire a congruential sequence according to a code length of a target polar code; an electronic component 706 configured to perform sorting processing on the congruential sequence according to a preset rule, to acquire a reference sequence; an electronic component 708 configured to determine a mapping function according to the congruential sequence and the reference sequence; and an electronic component 710 configured to interleave the target polar code according to the mapping function, to generate interleaved output bits.

According to the foregoing solution, a congruential sequence is determined based on a code length of a polar code, and interleaving of a target polar code is implemented by using the congruential sequence, which can enable a sequence of bits obtained after the interleaving to have a more uniform structure, can reduce a frame error rate and improve HARQ performance, thereby improving reliability of communication; can be applicable to rate matching processes of polar codes of various code lengths, and has good commonality and practicality.

In addition, the system 700 may include a memory 712, and the latter stores an instruction used to implement functions related to the electronic components 704, 706, 708, and 710. Although it is shown that the electronic components 704, 706, 708, and 710 are outside the memory 712, it may be understood that one or more of the electronic components 704, 706, 708, and 710 may exist in the memory 712.

The foregoing description includes examples of one or more embodiments. Certainly, it is impossible to describe all possible combinations of components or methods to describe these embodiments, but a person of ordinary skill in the art should know that these embodiments may be further combined and converted. Therefore, the embodiments described in this specification are aimed at including all changes, modifications, and variations that fall within the protection scope of the appended claims. In addition, for a term "contain" used in this specification or the claims, a coverage manner of the term is similar to that of "comprise", as explained by the term "comprise" used as a cohesive word in the claims.

A person of ordinary skill in the art may be aware that, in combination with the examples described in the embodiments disclosed in the present invention, units and algorithm steps may be implemented by electronic hardware or a combination of computer software and electronic hardware. Whether the functions are implemented in a hardware or software manner depends on specific applications and design constraint conditions of the technical solutions. A person skilled in the art may use different methods to implement the described functions for each specific application, but it should not be considered that the implementation goes beyond the scope of the present invention.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method comprising:
matching, by a wireless communication device in a wireless communication system, a rate of a polar code, comprising:
acquiring a congruential sequence according to a code length of a target polar code;
performing sorting processing on the congruential sequence according to a preset rule, to acquire a reference sequence;
determining a mapping function according to the congruential sequence and the reference sequence;
interleaving the target polar code according to the mapping function, to generate interleaved output bits; and
transmitting, in a hybrid automatic repeat request (HARQ) retransmission, a transmit bit obtained from the output bits to another wireless communication device in the wireless communication network.

2. The method according to claim 1, wherein the acquiring a congruential sequence according to a code length of a target polar code comprises:
determining the congruential sequence according to the following formula:

$x(0)=x_o$ $x(n+1)=[a*x(n)+c] \mod m, n=0,1,\ldots,(N-2),$ wherein
N is the code length of the target polar code, and $x_0$, a, c, and m are parameters.

3. The method according to claim 2, wherein $a=7^5$, $c=0$, and $m=2^{31}-1$.

4. The method according to claim 1, wherein the method further comprises:
performing order reversing processing on the interleaved output bits.

5. The method according to claim 1, wherein the method further comprises:
determining, according to a redundancy version (RV) parameter, a start location, in the interleaved output bits, of a transmit bit transmitted in the hybrid automatic repeat request (HARQ) retransmission.

6. The method according to claim 1, wherein the method further comprises:
obtaining, from the interleaved output bits by sequential interception or repetition, a transmit bit that needs to be transmitted in the hybrid automatic repeat request (HARQ) retransmission.

7. A rate matching apparatus for a polar code, the apparatus comprising:
a memory to store instructions;
a processor to execute the instructions to configure the apparatus to implement rate matching of a polar code by implementing:

an acquiring unit configured to acquire a congruential sequence according to a code length of a target polar code;

a sorting unit configured to perform sorting processing on the congruential sequence according to a preset rule, to acquire a reference sequence;

a determining unit configured to determine a mapping function according to the congruential sequence and the reference sequence; and an interleaving unit configured to interleave the target polar code according to the mapping function, to generate interleaved output bits used to obtain a transmit bit to be transmitted by a wireless communication device in a hybrid automatic repeat request (HARQ) retransmission to another wireless communication device.

8. The apparatus according to claim 7, wherein the acquiring unit is configured to acquire the congruential sequence according to the following formula:

$$x(0)=x_o$$

$$x(n+1)=[a*x(n)+c] \bmod m, n=0,1,\ldots,(N-2)$$

wherein

N is the code length of the target polar code, and $x_0$, a, c, and m are parameters.

9. The apparatus according to claim 8, wherein $a=7^5$, $c=0$, and $m=2^{31}-1$.

10. The apparatus according to claim 7, wherein the apparatus is further configured to implement:

an order reversing unit, configured to perform order reversing processing on the interleaved output bits.

11. The apparatus according to claim 7, wherein the apparatus is further configured to implement:

a transmitting unit, configured to determine, according to a redundancy version (RV) parameter, a start location, in the interleaved output bits, of a transmit bit transmitted in hybrid automatic repeat request (HARQ) retransmission.

12. The apparatus according to claim 7, wherein the apparatus is further configured to implement:

a transmitting unit, configured to obtain, from the interleaved output bits by sequential interception or repetition, a transmit bit that needs to be transmitted in the hybrid automatic repeat request (HARQ) retransmission.

13. A wireless communications device, the device comprising:

a non-transitory memory configured to store an instruction;

a processor to execute the instruction to configure the device to implement rate matching of a polar code by performing the following operations:

acquiring a congruential sequence according to a code length of a target polar code;

performing sorting processing on the congruential sequence according to a preset rule, to acquire a reference sequence;

determining a mapping function according to the congruential sequence and the reference sequence;

interleaving the target polar code according to the mapping function, to generate interleaved output bits; and a transmitter to transmit, in a hybrid automatic repeat request (HARQ) retransmission, a transmit bit obtained from the output bits to another wireless communication device.

14. The wireless communications device according to claim 13, wherein the processor determines the congruential sequence according to the following formula:

$$x(0)=x_o$$

$$x(n+1)=[a*x(n)+c] \bmod m, n=0,1,\ldots,(N-2)$$

wherein

N is the code length of the target polar code, and $x_0$, a, c, and m are parameters.

15. The wireless communications device according to claim 14, wherein $a=7^5$ $c=0$, and $m=2^{31}-1$.

16. The wireless communications device according to claim 13, wherein the processor:

performs order reversing processing on the interleaved output bits.

17. The wireless communications device according to claim 13, wherein the processor:

determines, according to a redundancy version (RV) parameter, a start location in the interleaved output bits of a transmit bit transmitted in the hybrid automatic repeat request (HARQ) retransmission.

18. The wireless communications device according to claim 13, wherein the processor:

obtains, from the interleaved output bits by sequential interception or repetition, a transmit bit that needs to be transmitted in the hybrid automatic repeat request (HARQ) retransmission.

* * * * *